United States Patent [19]

Hikami

[11] Patent Number: 4,580,001

[45] Date of Patent: Apr. 1, 1986

[54] PACKAGING DEVICE FOR ELECTRONIC COMPONENT

[75] Inventor: Masahiro Hikami, Nara, Japan

[73] Assignee: Sharp Kabushiki Kaisha, Osaka, Japan

[21] Appl. No.: 593,502

[22] Filed: Mar. 26, 1984

[30] Foreign Application Priority Data

Apr. 13, 1983 [JP] Japan ............................ 58-55870[U]

[51] Int. Cl.[4] ........................ H01L 31/04; H01R 3/00

[52] U.S. Cl. .................................... 136/259; 136/291; 339/147 R; 364/708

[58] Field of Search .............................. 136/259, 291; 339/147 R; 429/100; 364/708

[56] References Cited

U.S. PATENT DOCUMENTS

| | | | |
|---|---|---|---|
| 4,113,341 | 9/1978 | Hughes | 339/147 R |
| 4,257,821 | 3/1981 | Kelly et al. | 136/244 |
| 4,281,208 | 7/1981 | Kuwano et al. | 136/249 |
| 4,352,052 | 9/1982 | Opper | 320/2 |

*Primary Examiner*—Aaron Weisstuch

*Attorney, Agent, or Firm*—Birch, Stewart, Kolasch & Birch

[57] ABSTRACT

A device for packaging at least one electronic component comprises a housing for storing the at least one electronic component, and connecting terminals for electrically connecting the at least one electronic component to one or more other electronic components, the connecting terminals engaging elastically the at least one electronic component on the housing.

2 Claims, 4 Drawing Figures

PACKAGING DEVICE FOR ELECTRONIC COMPONENT

BACKGROUND OF THE INVENTION

The present invention relates to a packaging device for an electronic component and, more particularly, to a device for packaging an electronic component such as a capacitor, a resistor or the like, which is electrically and elastically connected to the other electronic components such as an LSI or a liquid crystal display device without a printed wiring base.

In an electronic apparatus having a solar cell as a power source, electronic components such as a capacitor for preventing an instantaneous power-off condition, or a light emitting diode (LED) or the like, are additionally required to be arranged in the electronic apparatus. These components are separately manufactured and, normally, these componenets are not included in the LSI.

In the case where the electronic component is electrically connected to the LSI or the liquid crystal display device, after the electronic component is soldered on the pattern of a printed wiring base, the printed wiring base is connected to the LSI or the liquid crystal device via a flexible base, so that the electronic component can be connected to the LSI or the liquid crystal display device.

However, in the above packaging, the positioning of the electronic component becomes difficult near the printed wiring base, and a soldering process is additionally required as one of the packaging processes, so that the number of the packaging processes is increased and each of the packaging processes become complex, and further, the above packaging is not suitable for automatic manufacturing.

SUMMARY OF THE INVENTION

In view of the above disadvantages of the conventional packaging of the electronic component, it is an object of the present invention to provide a device for packaging an electronic component suitable for automatic manufacturing.

It is another object of the present invention to provide a packaging device for an electronic component without soldering.

It is still another object of the present invention to provide a packaging device for electrically connecting an electronic component to other electronic components elastically.

It is further object of the present invention to provide a packaging device for packaging an electronic component together with other electronic components without using a printed wiring base.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications with the spirit and scope of the invention will become apparent to those skilled in the art from this detailed description.

According to an embodiment of the present invention, a device for packaging at least one electronic component comprises housing means for storing the electronic component, and connecting means for electrically connecting the at least one of the electronic components to one or more other electronic components, the connecting means elastically engaging the at least one electronic component on the housing means. In the above embodiment, the housing means comprises engaging means for elastically connecting the connecting means and means for storing the electronic component, and the connecting means comprises crow means for engaging the engaging means and means for carrying the electronic component. Further, the device is used in an electronic apparatus such as an electronic calculator or the like.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE INVENTION

Figure 1:
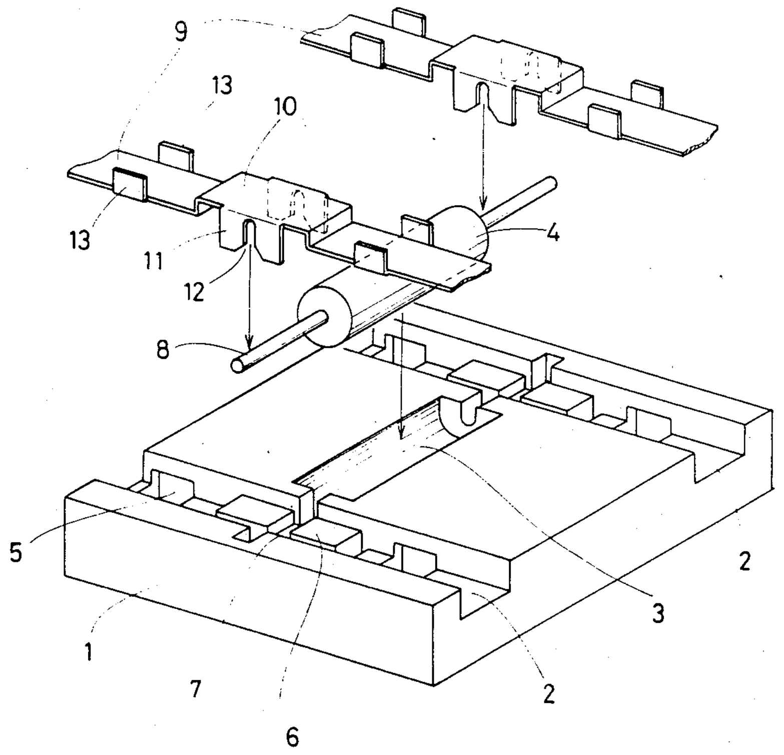
FIG. 1 shows a perspective view of a packaging device of an embodiment of the present invention.

Referring to FIG. 1, there is illustrated a perspective view of a packaging device according to an embodiment of the present invention. A housing 1 is formed by a resin, and is provided with engaging grooves 2 on both sides of the upper surface of the housing 1 for elastically engaging connecting terminals 9 as will be described later. A concave receptacle 3 is provided for storing therein an electronic component 4 such as a resistor or a capacitor between the engaging grooves 2.

Undercut portions 5 are provided for inserting crows 13 of the connecting terminals 9 at the suitable positions of the wall surfaces of the engaging grooves 2. Lead receptacles 6 are formed by partially projecting the lower portions of the engaging grooves 2 for carrying leads 8 of the electronic component 4, and are provided with concave grooves 7 for storing the leads 8 of the electronic component 4 on the upper surface of the lead receptacles 6, so that the leads 8 of the electronic component 4 are held by the concave grooves 7 on the lead receptacles 6 of the engaging grooves 2 when the electronic component 4 is placed into the concave receptacle 3.

Each of the connecting terminals 9 is made of an electrically conductive material having elastic property. The shape of each of the connecting terminals 9 is formed as shown in FIG. 1. For example, projected portion 10 is adapted to engage with the lead receptacle 6.

Bent crows 11 are formed by bending both sides of the projected portion 10, and each of the bent crows 11 is provided with a slit 12 adapted for binding the lead 8 of the electronic component 4 at the center of the bent crow 11. Further, the pair of crows 13 are formed by being bent in the upward direction for matching with and engaging with the undercut portions 5.

Accordingly, in the above construction, if the electronic component 4 is stored in the concave receptacle 3 of the housing 1 and the connecting terminals 9 are pressed to inserted into the engaging grooves 2, the leads 8 of the electronic component 4 are inserted to fit the slits 12 of the bent crows 11 of the connecting terminals 9, and at the same time, the pair of crows 13 of the connecting terminals 9 engage the undercut portions 5 formed in the engaging grooves 2, so that the connecting terminals 9 are elastically connected to the housing 1. Therefore, the electronic component 4 cannot be removed from the concave receptacle 3, and the leads 8 of the electronic component 4 are electrically connected to the connecting terminals 9.

In the case where the connecting terminals 9 are electrically connected to the other electronic components, the ends of the connecting terminals 9 are elastically connected with the terminals of the other electronic components. Each of the ends of the connecting terminals 9 may have a projection for achieving an exact connecting of the elements.

Figure 2A:
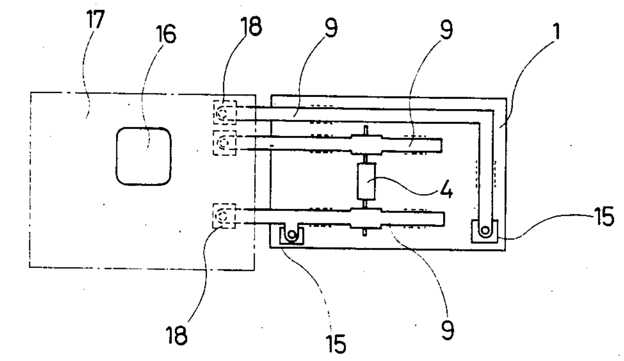
FIGS. 2(*a*) and 2(*b*) show views of a packaging device connected to an LSI and a solar power cell and FIG. 3 shows a view of an electronic calculator arranging the packaging device connected to the LSI and the solar cell as shown in FIGS. 2(*a*) and 2(*b*).
Figure 2B:
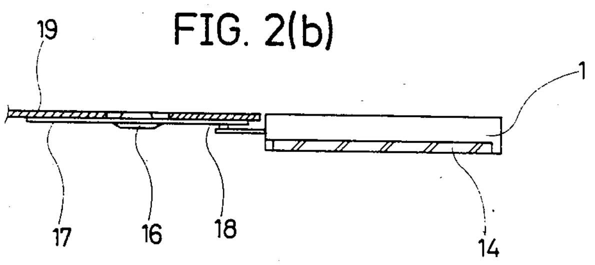
Figure 3:
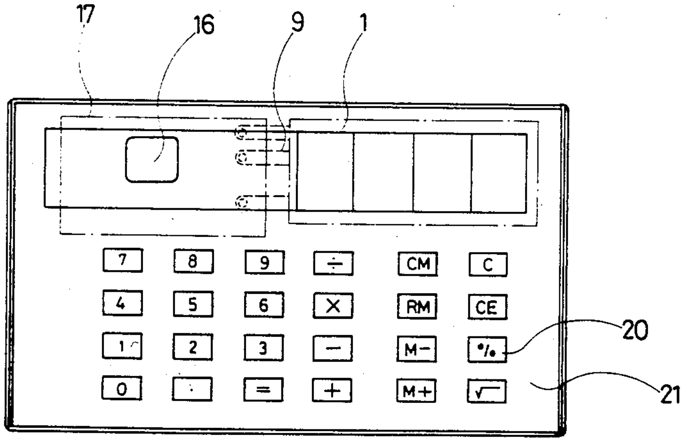

FIGS. 2(*a*) and 2(*b*) show views explaining the connection of the packaging device to an LSI and a solar power cell. FIG. 3 shows a view of an electronic calculator comprising the packaging device connected to the LSI and the solar cell as shown in FIGS. 2(*a*) and 2(*b*).

In this embodiment, when the connecting terminals 9 are inserted in the grooves 2 of the housing 1 to carry the electronic component 4, the connecting terminals 9 are electrically connected to the terminals of the LSI and the terminals of the solar cell.

In this case, the solar cell 14 is attached at the lower surface of the housing 1, and is provided with terminals 15 at the upper surface of the housing 1. The LSI 16 is disposed on a film 17 formed of a resin, called a film carrier type LSI. The terminals 18 of the LSI 16 are provided on one surface of the film 17. A hard base 19 is adhered to at the other surface of the film 17, the hard base 19 having an opening at the position corresponding to the LSI 16. The connecting terminal is provided for elastically and electrically connecting the terminals of the LSI with the terminals of the solar cell.

Therefore, in the case where the electronic calculator is constructed by using the above packaging device, the base 19 disposed on the film carrier type LSI, and the solar cell 14 are set in the lower housing of the electronic calculator, and the housing 1 mounting the electronic component 4 by means of the connecting terminals 9 is placed on the solar cell, and further, a keyboard 20 and an upper housing 21 are disposed thereon. The electronic component 4, the LSI, and the solar cell are electrically connected by the connecting terminals 9 and 9′ without soldering. Accordingly, the components for manufacturing the electronic calculator may be merely stacked, so that the electronic apparatus using the packaging device of the present invention may be suitable for mass production and compactness.

A plurality of the electronic components may be packaged on the housing 1 by the connecting terminals 9.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A device for packaging at least one electronic component which is electrically and elastically connected to an LSI and a solar cell which comprises housing means containing at least one concave receptacle for supporting said electronic component, engaging grooves disposed on opposite sides of said concave receptacle, connecting terminals adapted to conform to said engaging grooves, a solar cell disposed at one surface of said housing means and a LSI disposed juxtaposed to said housing means, said solar cell and LSI being electrically connected to said connecting terminals, and said connecting terminals electrically and elastically engaging the electronic component on the housing means.

2. The device of claim 1 wherein the connecting terminals include crow means for engaging the engaging grooves.

* * * * *